United States Patent [19]
Gardner et al.

[11] Patent Number: 5,888,853
[45] Date of Patent: Mar. 30, 1999

[54] INTEGRATED CIRCUIT INCLUDING A GRADED GRAIN STRUCTURE FOR ENHANCED TRANSISTOR FORMATION AND FABRICATION METHOD THEREOF

[75] Inventors: Mark I. Gardner, Cedar Creek; Daniel Kadosh; Michael Duane, both of Austin, all of Tex.

[73] Assignee: Advanced Micro Devices, Inc., Sunnyvale, Calif.

[21] Appl. No.: 905,482

[22] Filed: Aug. 1, 1997

[51] Int. Cl.[6] .......................... H01L 21/00; H01L 21/84; H01L 200/8238
[52] U.S. Cl. .......................... 438/152; 438/154; 438/200
[58] Field of Search .......................... 438/152, 154, 438/200, 205, 275, 211, 261

[56] References Cited

U.S. PATENT DOCUMENTS

| | | | |
|---|---|---|---|
| 4,916,507 | 4/1990 | Boudou et al. . | |
| 4,939,568 | 7/1990 | Kato et al. | 257/723 |
| 5,128,745 | 7/1992 | Takasu et al. . | |
| 5,426,072 | 6/1995 | Finnila | 438/107 |
| 5,429,968 | 7/1995 | Koyama | 438/152 |
| 5,661,325 | 8/1997 | Hayashi et al. . | |
| 5,751,050 | 5/1998 | Ishikawa et al. . | |
| 5,770,482 | 7/1998 | Kadosh et al. | 438/152 |

FOREIGN PATENT DOCUMENTS

| | | |
|---|---|---|
| 58-43554 A | 3/1983 | Japan . |
| 63-211672 A | 9/1988 | Japan . |

Primary Examiner—John F. Niebling
Assistant Examiner—Christopher Lattin
Attorney, Agent, or Firm—Skjerven, Morrill, MacPherson, Franklin & Friel LLP; Ken J. Koestner

[57] ABSTRACT

An elevated transistor formation includes a plurality of planes upon which transistors are formed. The plurality of transistor planes are formed at multiple relative elevations overlying a substrate wafer using deposited polysilicon to form a substrate between the layers. The polysilicon is deposited in a multiple-grain form to achieve an advantageous balance between deposition rate and substrate quality. In particular, columnar polysilicon is deposited at a temperature of approximately 620° C. and above to achieve a high deposition rate directly overlying a lower-elevation transistor plane. High quality polysilicon is then deposited overlying the columnar polysilicon layer at a temperature of approximately 580° C. or below. The deposition rate for high quality polysilicon is substantially lower than the deposition rate for columnar polysilicon. The highest quality substrate, upon which transistors in an elevated transistor plane are formed, is amorphous polysilicon.

10 Claims, 7 Drawing Sheets

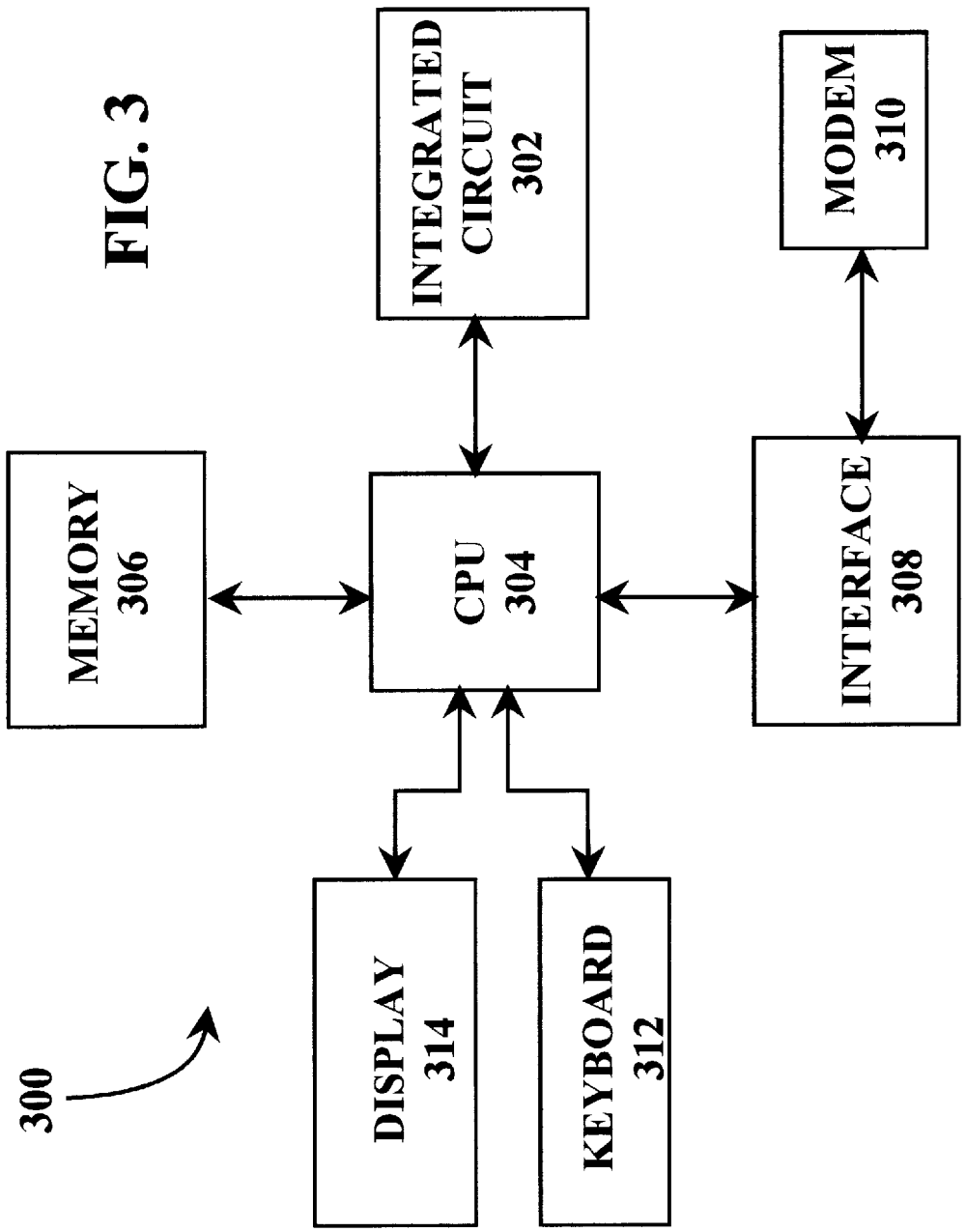

INTEGRATED CIRCUIT INCLUDING A GRADED GRAIN STRUCTURE FOR ENHANCED TRANSISTOR FORMATION AND FABRICATION METHOD THEREOF

BACKGROUND OF THE INVENTION

1. Field of the Invention

The present invention relates to an integrated circuit and fabrication method. More specifically, the present invention relates to an integrated circuit including transistors formed in a plurality of planes overlying a substrate using a graded grain structure to form a semiconductor region between the transistor planes.

2. Description of the Related Art

Polysilicon is deposited as a semiconductor substrate during fabrication of integrated circuits using a chemical vapor deposition (CVD) technique. The structure and properties of polysilicon are determined by CVD characteristics including deposition temperature, and dopant type and concentration. The structure and properties of polysilicon are also determined by thermal cycling operations performed subsequent to chemical vapor deposition. Typical polysilicon deposition processes are performed at a temperature range from approximately 600° C. to 650° C. Deposition is made from a silane ($SiH_4$) silicon source, generally either a 100% silane source or silane in combination with nitrogen ($N_2$) or hydrogen ($H_2$) gas streams. At temperatures below 580° C. the as-deposited film is amorphous. At temperatures above 580° C. the films deposit as polycrystalline silicon with formation of small pockets called crystallites or grains of single-crystalline silicon separated by grain boundaries. Polysilicon having a crystallite structure is commonly called columnar polysilicon.

The crystals in polysilicon deposit in a preferred orientation which depends on the deposition temperature. At temperatures in the range from 580° C. to 600° C., a {311} preferred orientation is produced. The polycrystalline silicon is dominated by crystals with a {110} fiber axis with columnar grains for temperatures in the 625° C. range while a {100} orientation predominates in the 675° C. range.

Amorphous polysilicon films are recrystallized at temperatures from 500° C. to 1000° C. and tend to produce a crystalline structure having a strong {111} fiber texture. The texture and grain size are highly reproducible in polysilicon films that are crystallized from amorphous phase films, producing a grain size that is generally larger than the grain size of as-deposited films. As-deposited amorphous films tend to have a smoother surface than films grown at less than about 580° C. which occasionally have rough surfaces and films grown at 620° C. which always have a rough surface. The smooth surface of as-deposited amorphous polysilicon films is maintained even after annealing at temperatures from 900° C. to 1000° C. The smooth surface of an as-deposited amorphous film is attained at the expense of a slower deposition rate at a temperature of 580° C.

In addition to temperature, deposition and processing parameters including source concentration, pump speed, nitrogen flow, and other gas flows determine the deposition rate and grain size. For example, application of hydrogen ($H_2$) in the gas stream advantageously reduces the occurrence of surface impurities and moisture which in turn results in a reduced grain size. Moisture or oxygen impurities cause growth of silicon dioxide within the polysilicon, increasing the resistance of the polysilicon and increasing etchability in subsequent masking steps.

The presence of dopants in the gas stream influence the grain size. Typically a strip of polysilicon is used in integrated circuits to function as a conductor. Doping is used to decrease resistivity of the polysilicon.

The quality of polysilicon in terms of characteristics including grain size and grain boundary consistency determines the electrical performance of devices constructed in the polysilicon based on the electrical current flow characteristics of the films. Current resistance arises as electrical current crosses grain boundaries in the polysilicon with larger grain boundaries being associated with a higher resistance. The fabrication of integrated circuits having a consistent current flow from device to device and within a device depends on control of the polysilicon structure.

One problem that arises in the fabrication of integrated circuits is that a high quality polysilicon is needed to built transistors and devices have suitable performance. Unfortunately the deposition rate of high quality amorphous polysilicon is too low, often on the order of 15 to 20 Å per minute so that the deposition polysilicon layers of suitable thickness, for example 1000 to 5000 Å, requires a processing time of 50 minutes to about five hours. This deposition time is too long to fabricate integrated circuits with an effective throughput and a reasonable cost.

What is needed is a polysilicon structure and deposition technique that achieves a suitable deposition rate and fabrication throughput.

SUMMARY

A semiconductor fabrication technique has been discovered which achieves the manufacture of high performance transistors with a high fabrication throughput. The technique involves the deposition of graded grain structure in a layered stack formation including deposition of a layer of high quality amorphous polysilicon and deposition of a lower quality layer of columnar polysilicon.

An elevated transistor formation includes a plurality of planes upon which transistors are formed. The plurality of transistor planes are formed at multiple relative elevations overlying a substrate wafer using deposited polysilicon to form a substrate between the layers. The polysilicon is deposited in a multiple-grain form to achieve an advantageous balance between deposition rate and substrate quality. In particular, columnar polysilicon is deposited at a temperature of approximately 620° C. and above to achieve a high deposition rate directly overlying a lower-elevation transistor plane. High quality amorphous polysilicon is then deposited overlying the columnar polysilicon layer at a temperature of approximately 580° C. or below. The deposition rate for high quality amorphous polysilicon is substantially lower than the deposition rate for columnar polysilicon. The highest quality substrate, upon which transistors in an elevated transistor plane are formed, is amorphous polysilicon.

In one embodiment, the integrated circuit is constructed with a 1.0 micron (10,000 Å) well depth. The graded grain structure formed using the hybrid polysilicon deposition technique results in a highly manufacturable structure with optimum substrate quality.

In accordance with an aspect of the present invention, a technique for depositing polysilicon includes operations of determining a suitable polysilicon thickness specification for an integrated circuit or integrated circuit portion, and determining a specification of a suitable depth of the polysilicon thickness that is too be constructed in high quality amorphous polysilicon. The technique further includes an operation of depositing columnar polysilicon or polysilicon having a grain structure at a high temperature, and thus a high deposition rate. The columnar polysilicon is deposited to a thickness of the specified total polysilicon thickness less the specified thickness of high quality amorphous polysilicon. Following deposition of the columnar polysilicon, high quality amorphous polysilicon is deposited at a relatively low temperature and corresponding low deposition rate. A transistor or device is fabricated in the region of the high quality amorphous polysilicon. The technique advantageously results in fabrication of high quality transistors while attaining a high manufacturing throughput and concomitant reduction in manufacturing cost.

In accordance with another aspect of the present invention, an integrated circuit includes transistors and devices at a plurality of horizontal planes of substrate to form a flexible structure in which transistors are compactly arranged in three dimensions. The three dimensional transistor structure is made feasible and manufacturable through graded grain polysilicon deposition.

In accordance with a further aspect of the present invention, usage of graded grain polysilicon deposition enables efficient and highly manufacturable deposition of high-quality polysilicon at selected locations in a three-dimensional integrated circuit structure so that high-performance transistors may be fabricated in a stacked arrangement.

In accordance with an embodiment of the present invention, a method of fabricating an integrated circuit includes forming a transistor on a substrate, and forming an intralayer dielectric (ILD) layer overlying the substrate and the transistor. The method further includes depositing a layer of columnar polysilicon overlying the ILD layer at a relatively high temperature and a relatively fast deposition rate using chemical vapor deposition (CVD) and depositing a layer of amorphous polysilicon overlying the columnar polysilicon at a relatively low temperature and a relatively slow deposition rate using CVD. A multiple-transistor layer is built by forming a transistor on the layer of amorphous polysilicon.

In accordance with another embodiment of the present invention, an integrated circuit includes a substrate wafer, a transistor formed on the substrate wafer in a first transistor plane, and an intralayer dielectric (ILD) layer overlying the substrate and the transistor. The integrated circuit further includes a chemical vapor deposition (CVD) layer of columnar polysilicon overlying the ILD layer, a CVD layer of amorphous polysilicon overlying the columnar polysilicon, and a transistor formed on the layer of amorphous polysilicon in a second transistor plane.

Many advantages are gained by the described integrated circuit and corresponding fabrication method. The integrated circuit and fabrication method advantageously permit construction of much higher performance transistors while achieving a high throughput, thereby improving the feasibility of an integrated circuit utilizing transisters formed on multiple transistor planes. The illustrative technique using variation of temperature alone to control deposition rate and polysilicon quality is highly advantageous for achieving a large increase in deposition rate for production of the columnar polysilicon layer and large improvements in polysilicon quality in the production of amorphous polysilicon layer in a simple and controllable manner.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 3 is a schematic block diagram illustrating a computer system including an integrated circuit including a graded grain structure for enhanced transistor formation fabricated using a method depicted in FIGS. 1A through 1C, and FIGS. 2A through 2I.

DETAILED DESCRIPTION OF THE ILLUSTRATIVE EMBODIMENTS

Figure 1A:
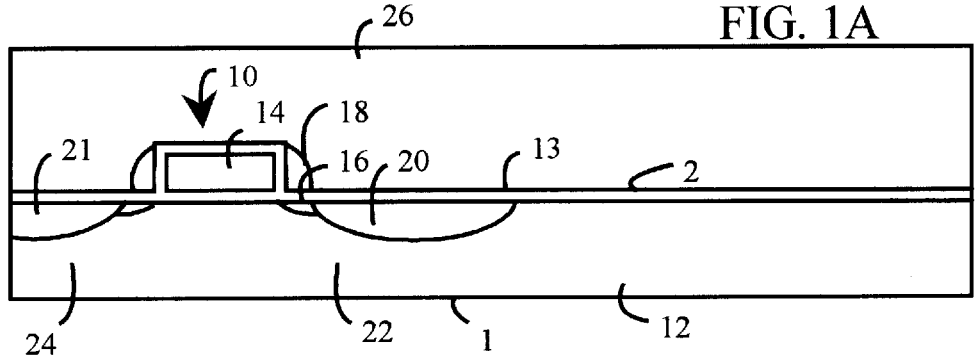
FIGS. 1A through 1D depict a sequence of schematic cross-sectional views that portray a summary of an embodiment of a fabrication process for forming an integrated circuit including a graded grain structure for enhanced transistor formation in accordance with an aspect of the present invention.

FIG. 1A depicts a portion of a semiconductor wafer 1 showing a cross-sectional view of a MOSFET 10 formed on a transistor layer 2 of a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon nitride or silicon dioxide spacers 18 are formed lateral to the polysilicon gate 14.

Following formation of the spacers 18, a heavily-doped drain implant 20 is implanted on a drain side 22 of the MOSFET 10. A source side 24 of the MOSFET 10 may be implanted with a heavily-doped source implant 21. An intralayer dielectric (ILD) layer of silicon dioxide 26 is deposited over the substrate 12 and the polysilicon gate 14 and spacers 18 to electrically isolate devices formed on the substrate 12. The ILD layer of silicon dioxide 26 is deposited in a thick layer, for example in a range from approximately 1000 Å to about 25000 Å and planarized. The ILD layer of silicon dioxide 26 mutually isolates devices on the surface of the substrate 12 and isolates the devices from overlying conductive layers that are subsequently formed.

Figure 1B:
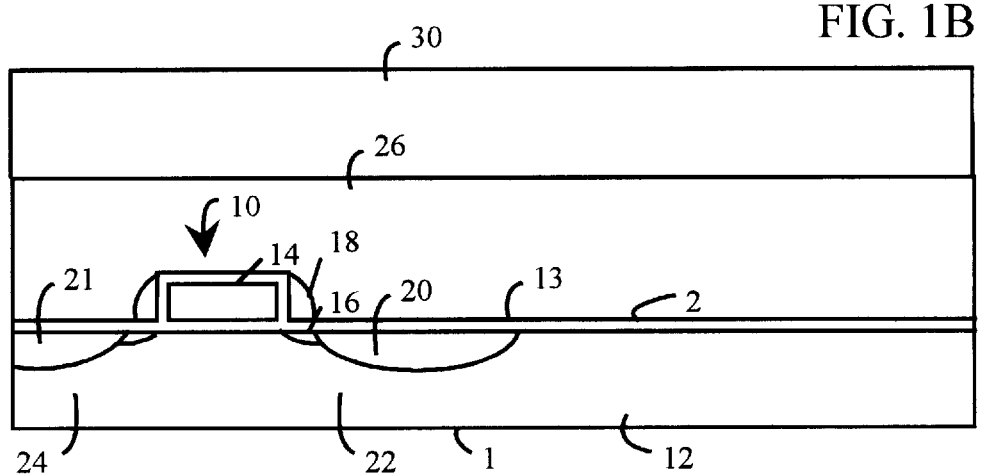

A multiple-layer integrated circuit is designed and specified to include a selected substrate thickness between multiple transistor layers. The multiple-layer integrated circuit is further specified to include a selected depth of high-quality amorphous polysilicon for forming an elevated transistor level. Referring to FIG. 1B, a columnar polysilicon layer 30 having a grain structure is deposited overlying the intralayer dielectric (ILD) layer of silicon dioxide 26 over the entire surface of the semiconductor wafer 1. The thickness of the columnar polysilicon layer 30 is specified to equal the difference between the total selected substrate thickness and the high-quality polysilicon depth. The columnar polysilicon layer 30 is deposited at a temperature greater than 580° C. for a low pressure chemical vapor deposition (LPCVD) process using silane ($SiH_4$) as the deposition gas. For other gases, the deposition temperature may be varied although the temperature for depositing the columnar polysilicon layer 30 is always relatively higher than the temperature for depositing amorphous polysilicon using the same deposition gas. The columnar polysilicon layer 30 is deposited at temperatures that are relatively higher than the temperature for depositing amorphous polysilicon to attain a much higher deposition rate.

The higher processing temperatures for depositing columnar polysilicon layer 30 are advantageous for attaining columnar polysilicon deposition rates in a range from 100–200 Å per minute. Thick layers of columnar polysilicon are typically deposited to thicknesses in a range from 1000 Å to 5000 Å so that processing times from about 5–50 minutes are achieved. Deposition of amorphous silicon of the same depths would take ten times the processing duration.

Figure 1C:
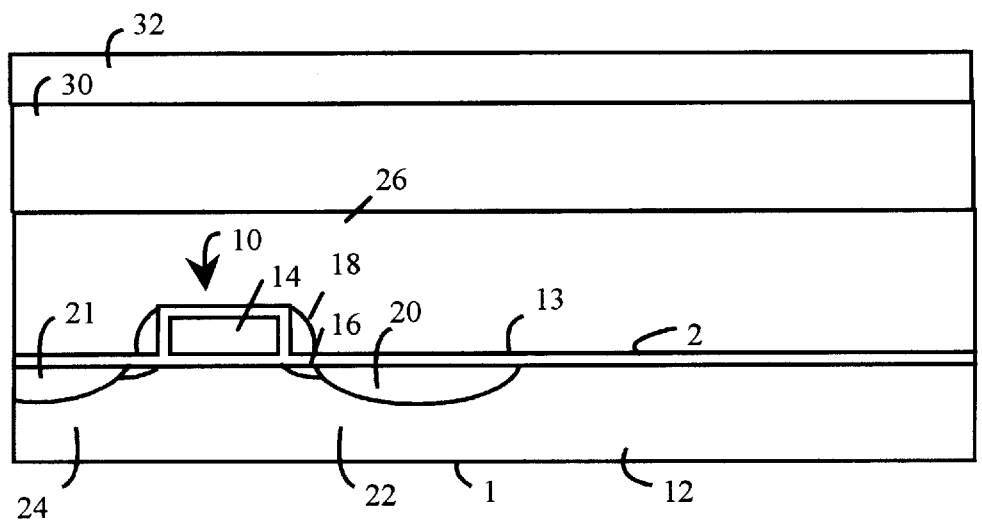

Referring to FIG. 1C, a high-quality amorphous polysilicon layer 32 is deposited overlying the columnar polysilicon layer 30 forming a much more pristine silicon surface in comparison to the columnar polysilicon layer 30. In the illustrative embodiment, the amorphous polysilicon layer 32 is deposited at a temperature less than 580° C. for a low pressure chemical vapor deposition (LPCVD) process using silane ($SiH_4$) as the deposition gas. The amorphous polysilicon layer 32 is deposited at temperatures that are relatively lower than the temperature for depositing amorphous polysilicon to produce a high quality polysilicon that is formed at a much lower deposition rate. Deposition rates for the amorphous polysilicon layer 32 typically range from about 15–20 Å/minute for deposition using silane as the deposition gas. Common thicknesses for the amorphous polysilicon layer 32 are less than 1000 Å so that deposition rates for the amorphous polysilicon layer 32 are about an hour.

Figure 1D:
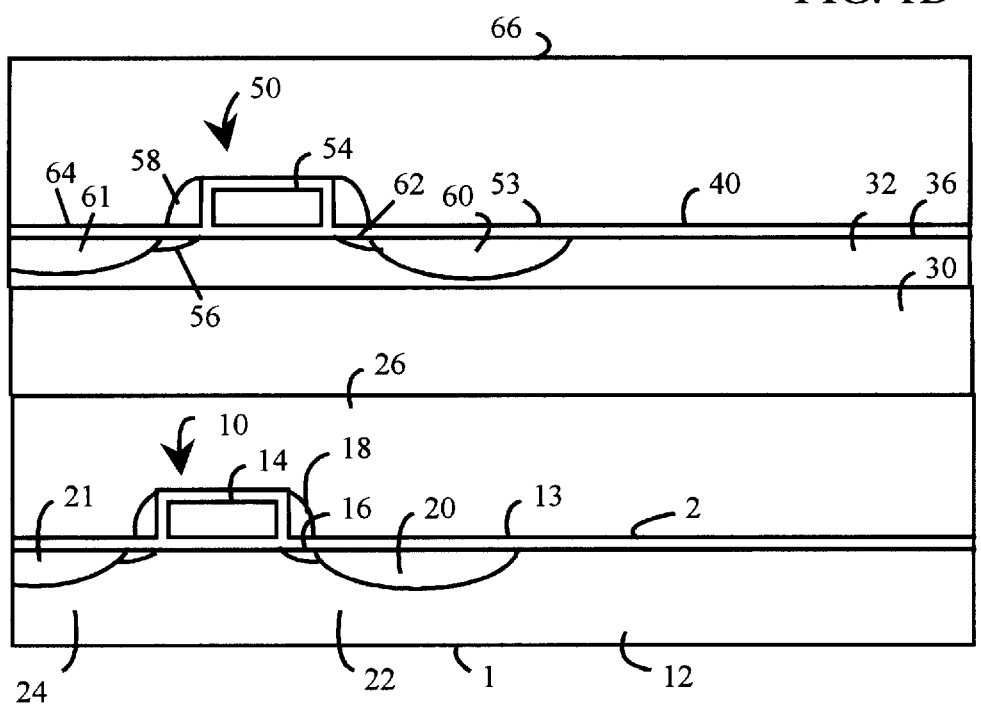

Referring to FIG. 1D, a second layer of transistors 40 is fabricated on a plane 36 of the amorphous polysilicon layer 32. A problem arising in the fabrication of an integrated circuit having multiple layers of transistors is that large thicknesses of a polysilicon are used to support multiple transistors and devices, including support for isolation structures for electrically isolating the devices. The polysilicon is to have a quality suitable for constructing transistors. The technique of depositing columnar polysilicon layer 30 at a high deposition rate followed by forming a high-quality amorphous polysilicon layer 32 advantageously permits construction of much higher performance transistors while achieving a high throughput, thereby improving the feasibility of an integrated circuit utilizing transisters formed on multiple transistor planes.

In the second transistor layer 40, transistors are constructed using the same techniques for forming devices on the first transistor layer. For example, an LDD MOSFET 50 includes a gate oxide layer 53 overlying the amorphous polysilicon layer 32, a polysilicon gate 54, and implanted LDD regions 56 in the amorphous polysilicon layer 32 self-aligned with the polysilicon gate 54. Silicon nitride or silicon dioxide spacers 58 are formed lateral to the polysilicon gate 54. The MOSFET 50 also includes a heavily-doped drain implant 60 implanted on a drain side 62 of the MOSFET 50. A source side 64 of the MOSFET 50 is shown implanted with a heavily-doped source implant 61. A second-level intralayer dielectric (ILD) layer of silicon dioxide 66 is deposited over the amorphous polysilicon layer 32 and the polysilicon gate 54 and spacers 58 to electrically isolate devices formed on the amorphous polysilicon layer 32. The second-layer ILD layer of silicon dioxide 66 is deposited in a thick layer, for example in a range from approximately 1000 Å to about 25000 Å and planarized. The ILD layer of silicon dioxide 66 mutually isolates devices on the surface of the amorphous polysilicon layer 32 and isolates the devices from overlying conductive layers that are subsequently formed.

Figure 2A:
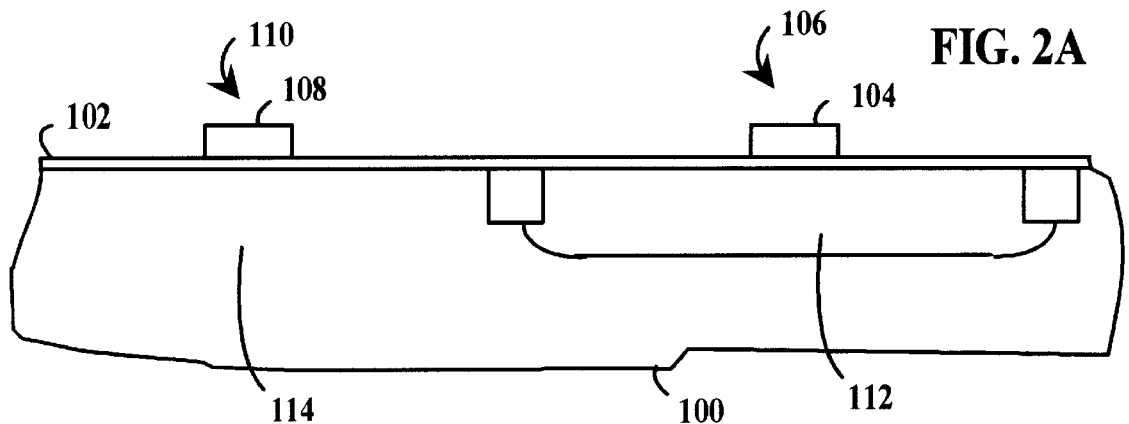
FIGS. 2A through 2I depict a sequence of schematic cross-sectional views of a silicon wafer during processing for forming an integrated circuit including a graded grain structure for enhanced transistor formation.

Referring to FIGS. 2A through 2I, a series of schematic cross-sectional views of a silicon wafer 100 illustrate a more detailed view of processing for forming an integrated circuit including a graded grain structure for enhanced transistor formation. Referring to FIG. 2A, an exemplary embodiment is shown in which NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16} cm^3$. The starting material is typically a heavily-doped<100>-orientation silicon substrate having a quality suitable for integrated circuit manufacture. A thin (5 μm to 10 μm) lightly-doped epitaxial layer is grown on the silicon substrate. The illustrative epitaxial layer is a P-type epitaxial surface layer with a<100> orientation and a resistivity of 12 ohm-cm. Either an n-epi-on-n$^+$ or a p-epi-on-p$^+$ substrate may be used for the epitaxial layer. The a p-epi-on-p$^+$ substrate is more typically used due to a lesser sensitivity to process-induced defects. The silicon substrate and the epitaxial layer in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/$cm^2$ and an energy in the range from about 10 keV to 100 keV, an energy insufficient to penetrate a trench or field oxide isolation (not shown). The $V_T$ adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/$cm^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30 Å to 150 Å forms a gate oxide layer 102 on the top surface of the silicon wafer 100 by tube growth at a temperature of 700° C. to 1000° C. in an $O_2$ ambient.

In the illustrative embodiment, a polysilicon gate 104 for a P-channel transistor 106 and a polysilicon gate 108 for an N-channel transistor 110 are formed by depositing a layer of undoped polysilicon to a thickness of approximately 2000 Å by low pressure chemical vapor deposition (LPCVD) over the gate oxide layer 102. The polysilicon is doped using a technique selected from among several suitable techniques including doping in situ during deposition and doping prior to etching by implanting arsenic atoms with a dosage in a range from $1 \times 10^{15}$ to $5 \times 10^{16}$ atoms/cm$^2$ and an energy in a range from 2 to 50 kiloelectron-volts (keV). In another example, polysilicon is doped in a subsequent process step during introduction of dopant into the silicon wafer 100. The polysilicon gates 104 and 108 are formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gates 104 and 108 with substantially vertical side walls using an etching process that is highly selective of polysilicon. A reactive ion etch (RIE) removes the regions of gate oxide layer 102 except for portions underlying the polysilicon gates 104 and 108. The photoresist mask is stripped.

The polysilicon gate 104 of the P-channel transistor 106 overlies a region of N-doped substrate 112, such as an N-well. The polysilicon gate 108 of the N-channel transistor 110 overlies a region of P-doped substrate 114.

Figure 2B:
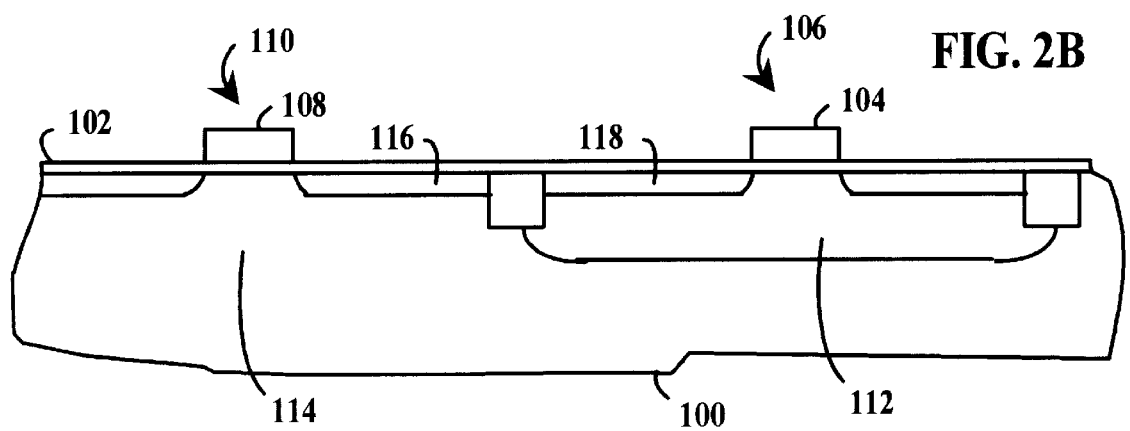

Referring to FIG. 2B, a first masking step and a first ion implant step form a N⁻ LDD implant and include applying a lightly-doped drain (LDD) mask to the silicon wafer 100 and implanting N⁻ ions to form N-channel transistor LDD regions 116 which are self-aligned with the polysilicongate 108. The N⁻ ion implantation process includes implanting arsenic at a dosage in the range of $1 \times 10^{13}$ to $5 \times 10^{14}$ atoms/cm$^2$ and an energy in the range of 2 to 50 keV, using the polysilicon gate 108 as an implant mask. A second masking step and a second ion implant step form a P⁻ LDD implant and include applying a lightly-doped drain (LDD) mask to the silicon wafer 100 and implanting P⁻ ions to form P-channel transistor LDD regions 118 which are self-aligned with the polysilicon gate 104. The P⁻ ion implantation process includes implanting boron or $BF_2$ at a dosage in the range of $1 \times 10^{13}$ to $5 \times 10^{14}$ atoms/cm$^2$ and an energy in the range of 2 to 50 keV, using the polysilicon gate 104 as an implant mask. The implant energy for a boron implant is typically much lower than the implant energy for the $BF_2$ since boron atoms are very light and implant too deeply at high energies.

Figure 2C:
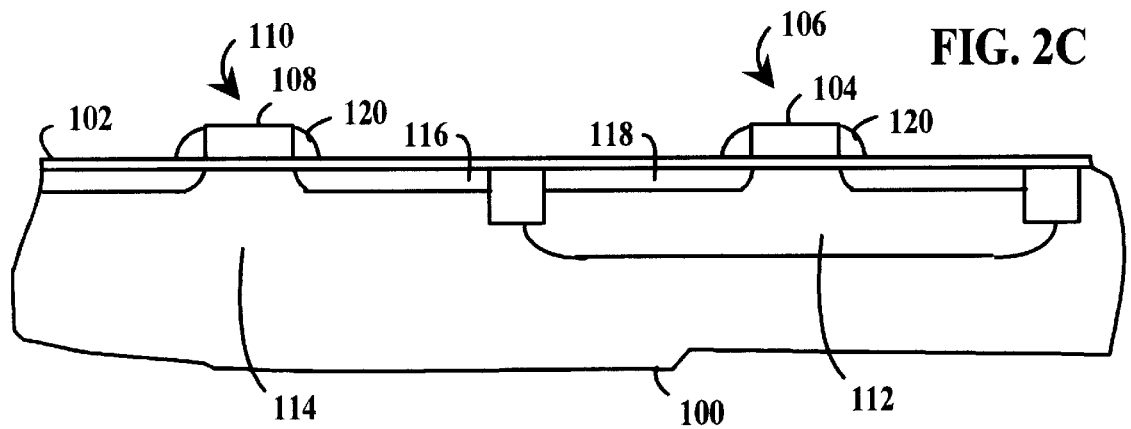

Referring to FIG. 2C, silicon nitride or silicon dioxide spacers 120 are formed on the substantially vertical side walls of the P-channel polysilicon gate 104 and the N-channel polysilicon gate 108. In one embodiment, silicon nitride spacers 120 are formed by chemical vapor deposition of a silicon nitride ($Si_3N_4$) film overlying the silicon wafer 100 and polysilicon gates 104 and 108. Silicon nitride films are amorphous insulating materials that serve as passivation and mechanical protective layers for integrated circuits. Silicon nitride films are suitable for usage as a passivation layer by acting as a nearly impervious barrier to diffusion, particularly diffusion of moisture and sodium.

A silicon nitride film is deposited using several techniques. In one technique, silicon nitride is deposited by high-temperature (700° C. to 800° C.) low pressure chemical vapor deposition (LPCVD) to produce a silicon nitride film with good uniformity. In a second technique, silicon nitride is deposited by a low temperature (200° C. to 400° C.) plasma-enhanced chemical vapor deposition (PECVD) that is compatible with low-melting-point metals such as aluminum. The silicon nitride layer is conformally deposited to a thickness in a range from 600 Å to 2000 Å and etched using a reactive ion etch (RIE) procedure that forms the spacers 120 adjacent to the edges of the polysilicon gates 104 and 108.

In the illustrative embodiment, the spacers 120 are formed directly in contact with the polysilicon gates 104 and 108 and directly in contact with the silicon wafer 100. In alternative embodiments, the spacers 120 may be formed separated from the polysilicon gates 104 and 108 by a thin oxide layer and separated from the silicon wafer 100 by a thin oxide layer.

The form of the P-channel transistor LDD regions 118 and the N-channel transistor LDD regions 116 determines the hot carrier performance of the transistors and is established by the profile of the spacers 120. For embodiments utilizing silicon nitride spacers 120, the spacer profile varies as a function of the spacer nitride etch time and the spacer nitride thickness. A suitable amount of over-etch is used to form the silicon nitride spacers 120. However, excessive over-etching reduces the width and height of the silicon nitride spacers 120 and causes gouging into the silicon of the silicon wafer 100. Control of the over-etch process becomes more difficult as the deposited spacer nitride layer thickness increases.

In alternative embodiments, materials other than silicon nitride may be employed as spacers on the gate electrodes. Advantages are gained by using a spacer material that is resistant to processes for etching a silicon dioxide (oxide) layer.

Figure 2D:
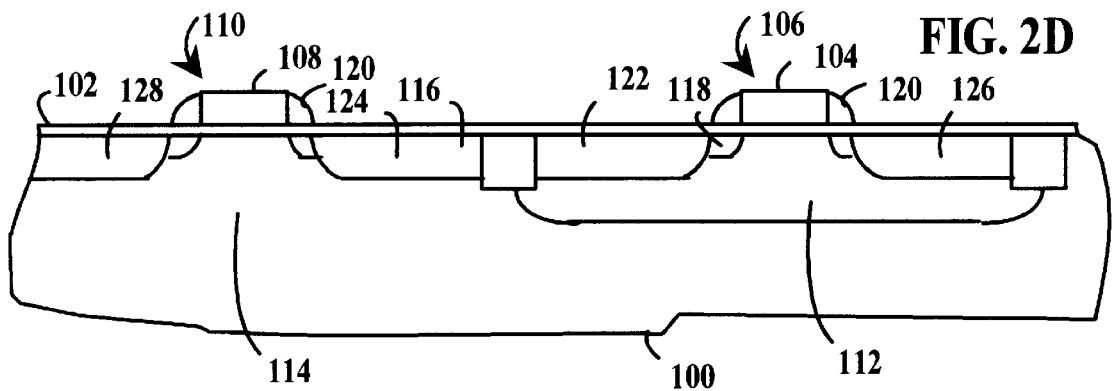

Referring to FIG. 2D, heavily doped drain regions including a P-channel drain region 122 and an N-channel drain region 124 and heavily doped source regions including a P-channel source region 126 and an N-channel source region 128 are implanted into the silicon wafer 100 by applying separate mask and implant processes for the P-channel transistor 106 and the N-channel transistor 110. The heavily-doped P-channel drain region 122 and heavily-doped P-channel source region 126 are implanted by injecting boron atoms or $BF_2$ molecules into a portion of the surface of the silicon wafer 100 that is self-aligned with the polysilicon gate 104 and the silicon nitride spacer 120 on the drain side and source side of the P-channel transistor 106, respectively. The boron atoms or $BF_2$ molecules are implanted at a dosage in the range of $1 \times 10^{15}$ to $5 \times 10^{15}$ atoms/cm$^2$ and an energy in the range of 10 KeV to 80 KeV to produce a boron or $BF_2$ concentration in the range of about $1 \times 10^{18}$ to $1 \times 10^{19}$ atoms/cm$^3$ and ajunction depth in the range of 200 Å to 3000 Å. Generally, a typical source/drain P+ ion implant process is a shallow implant and therefore utilizes an implantation of $BF_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. $BF_2$ ions are larger and heavier ions so that a higher energy implant achieves a shallow depth.

The heavily-doped N-channel drain region 124 and the N-channel source region 128 are implanted by injecting arsenic atoms into a portion of the surface of the silicon wafer 100 that is self-aligned with the polysilicon gate 108 and the silicon nitride spacer 120 on the drain side and the source side of the N-channel transistor 110, respectively. The arsenic atoms are implanted at a dosage in the range of $1\times10^{15}$ to $5\times10^{15}$ atoms/cm$^2$ and an energy in the range of 2 to 50 keV to produce an arsenic concentration in the range of about $1\times10^{18}$ to $1\times10^{19}$ atoms/cm$^3$ and a junction depth in the range of 200 Å to 3000 Å.

The junction depth of the P-channel drain region 122, the P-channel source region 126, the N-channel drain region 124, and the N-channel source region 128 is deeper than the depth of respective P-channel transistor LDD regions 118 and N-channel transistor LDD regions 116. The dopant concentration of the P-channel drain region 122 and the N-channel drain region 124 are sufficiently large to attain a conductive state of the respective P-channel polysilicon gate 104 and N-channel polysilicon gate 108 when connected to a suitably doped source.

The silicon wafer 100 is annealed to remove crystalline damage and activate and drive-in the implanted arsenic using a rapid thermal anneal process at a temperature in a range from 950° C. to 1050° C. for 10 to 60 seconds. The implanted boron or BF$_2$ in the silicon wafer 100 diffuses laterally and vertically, merging the P-channel drain region 122 with the P-channel transistor LDD region 118 in the vicinity of the P-channel drain region 122. The implanted arsenic in the silicon wafer 100 diffuses laterally and vertically to merge the N-channel drain region 124 with the N-channel transistor LDD regions 116 in the vicinity of the N-channel drain region 124.

Figure 2E:
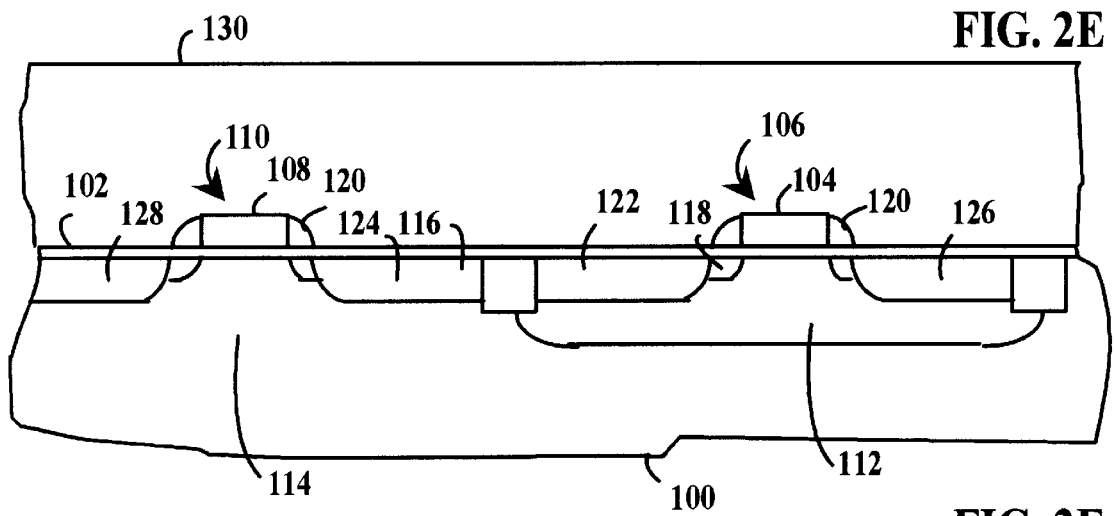

Referring to FIG. 2E, a blanket intralayer dielectric (ILD) layer of silicon dioxide (SiO$_2$) 130 is formed over the silicon wafer 100, covering the polysilicon gate 104 and spacers 120 of the P-channel transistor 106 and the polysilicon gate 108 and spacers 120 of the N-channel transistor 110. The LD oxide layer 130 with a thickness in the range of 1000 Å to 25000 Å is conformally deposited over the silicon wafer 100 by chemical vapor deposition (CVD) at a temperature in the range of 300° C. to 400° C. The thick ILD layer of silicon dioxide 130 is planarized, for example by chemical-mechanical polishing or by reflow. The ILD layer of silicon dioxide 130 mutually isolates devices including the P-channel transistor 106 and the N-channel transistor 110 on the surface of the silicon wafer 100 and isolates devices from overlying conductive layers.

Figure 2F:
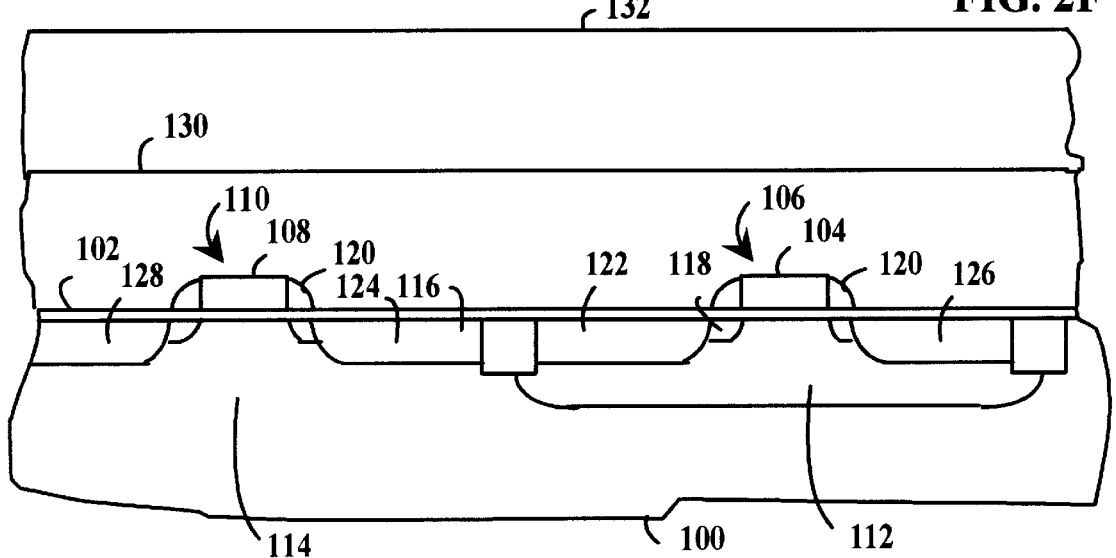

Referring to FIG. 2F, a blanket layer of columnar polysilicon layer 132 having a grain structure is deposited at a high temperature and high deposition rate overlying the intralayer dielectric (ILD) layer of silicon dioxide 130 over the silicon wafer 100. The columnar polysilicon layer 132 is deposited by low pressure chemical vapor deposition (LPCVD) on the top surface of the oxide layer 130 to a selected thickness generally in a range from 1000 Å to 5000 Å.

The columnar polysilicon layer 132 is generally deposited by pyrolysis, thermal decomposition of silane (SiH$_4$), in a selected temperature range above 580° C. and typically in a range from approximately 600° C. to 650° C. The most typical technique for depositing polysilicon is LPCVD on the basis of the uniformity and purity of the deposited polysilicon and economy of the process. In one embodiment, polysilicon is deposited using an LPCVD system by a process in which 100% silane is applied at total pressures ranging from 0.3–1 torr. Other process embodiments are also viable. For example, 25% silane may be applied with a nitrogen carrier at total pressures from 0.3–1 torr. Another exemplary process utilizes a vertical flow isothermal reactor configuration, applying 25% silane diluted in hydrogen at approximately 1 torr pressure.

Figure 2G:
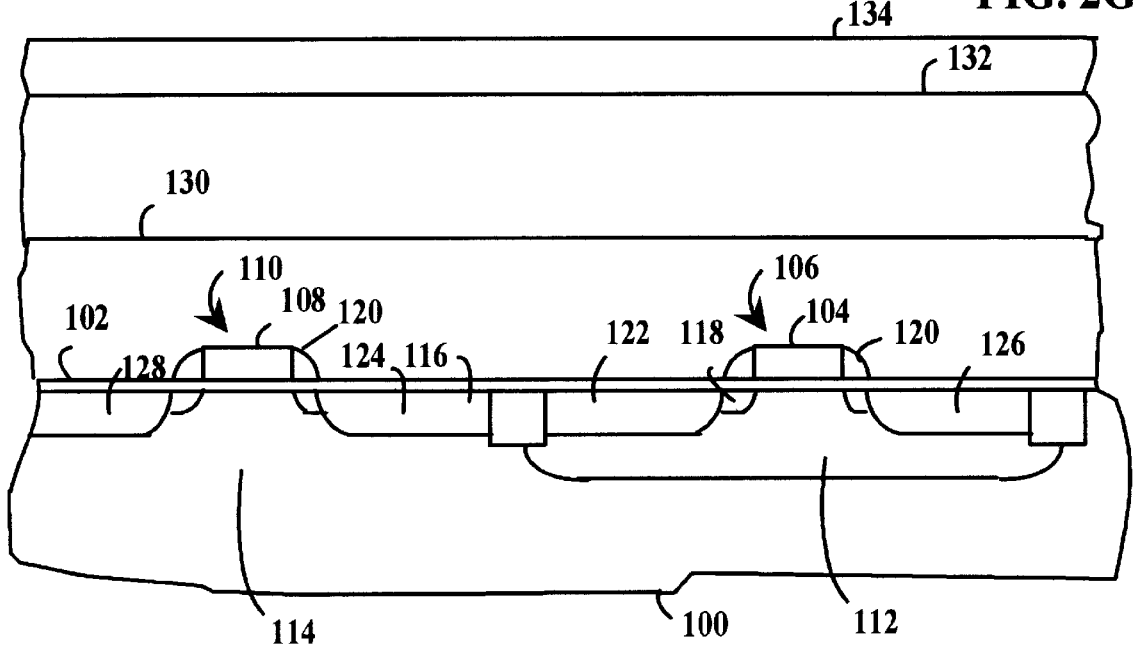

Referring to FIG. 2G, a high-quality amorphous polysilicon layer 134 is deposited overlying the columnar polysilicon layer 132. The amorphous polysilicon layer 134 is deposited at a temperature less than 580° C. in a low pressure chemical vapor deposition (LPCVD) process when silane (SiH$_4$) is used as the deposition gas. For other gases, the deposition temperature may be varied although the temperature for depositing the columnar polysilicon layer 132 is always relatively lower than the temperature for depositing amorphous polysilicon using the same deposition gas. The amorphous polysilicon layer 134 is deposited at a temperature that is lower than the temperature for depositing amorphous polysilicon to produce a high quality polysilicon. The lower deposition temperature leads to reduced deposition rates for the amorphous polysilicon layer 134 that typically range from about 15–20 Å/minute for deposition when silane is the deposition gas. Common thicknesses for the amorphous polysilicon layer 134 are less than 1000 Å so that deposition rates are reasonable.

In other embodiments, other deposition gases may be used including, for example, silicon tetrachloride (SiCl$_4$), dichlorosilane (SiH$_2$Cl$_2$), or trichlorosilane (SiHCl$_3$). Generally, any gas having a silicon source is suitable for deposition although particular gases do have superior deposition characteristics at feasible temperature ranges. In particular, silane is generally an advantageous deposition gas by virtue of a high deposition rate at a relatively low temperature.

Similarly, other deposition techniques may be employed in place of low-pressure chemical vapor deposition (LPCVD), such as plasma-enhanced chemical vapor deposition (PECVD), sputtered silicon, and the like.

In the illustrative embodiment, the acceleration in deposition rate for producing the columnar polysilicon layer 132 and the improvement in polysilicon quality for producing the amorphous polysilicon layer 134 are attained by differences in processing temperature while other processing parameters including deposition source gas, source concentration, pump speed, nitrogen flow, and other gas flows which determine the deposition rate and grain size are held constant. In other embodiments, other processing parameters may be varied while temperature is maintained constant to similarly control deposition rate and grain size to form a high-deposition rate columnar polysilicon layer 132 and a low-deposition rate high-quality amorphous polysilicon layer 134. In still other embodiments, different combinations of deposition parameters may be varied to attain the same result.

The illustrative technique using variation of temperature alone to control deposition rate and polysilicon quality is highly advantageous for achieving a large increase in deposition rate for production of the columnar polysilicon layer 132 and large improvements in polysilicon quality in the production of amorphous polysilicon layer 134 in a simple and controllable manner.

The highest quality substrate originates from amorphous deposition. Immediately following deposition, the amorphous polysilicon does not have a grain structure. The amorphous polysilicon layer 134 is subsequently annealed by heating the substrate at a selected temperature in a range from approximately 400° C. to about 900° C. to crystallize the amorphous polysilicon into a crystal structure having a grain size that is larger than the grain size for the columnar polysilicon layer 132. The amorphous polysilicon readily forms a large-size crystal upon annealing since the amorphous structure does not have grain boundaries or fracture lines that are only broken through the application of a large amount of energy. Note that, prior to annealing, polysilicon in the columnar polysilicon layer 132 has a larger grain size than the polysilicon in the amorphous polysilicon layer 134. A first annealing step causes the amorphous polysilicon layer 134 to form a single-crystal structure having a crystal size that is much larger than the grain size of the columnar polysilicon layer 132.

The single-crystal structure of the amorphous polysilicon layer 134 following annealing, which is nearly identical to the substrate of the semiconductor wafer 100, is the optimum structure for electrical performance of devices constructed in the polysilicon. The single-crystal structure enhances electrical properties due to the lack of grain structure and fracture lines within a crystal lattice that impede electron movement and are prone to leakage and poor conduction properties as charge carriers move in the source-drain pathway of a transistor.

The polysilicon layer may be doped with N-type dopants or P-type dopants. Typically the amorphous polysilicon layer 134 and the columnar polysilicon layer 132 are doped by either an implant operation or by doping during deposition using a dopant species and dosages that are selected to enhance transistor performance. The polysilicon layer is annealed and then planarized.

The single-crystal structure of the amorphous polysilicon layer 134 following the annealing process achieves additional performance advantages. First, the single-crystal structure activates the dopant much better than a multiple-grain structure. Second, amorphous silicon has improved dopant retardation properties in which dopants traversing an amorphous material make a shallower junction, resulting in high performance in MOSFETs and other circuit elements. Furthermore, the single-crystal structure advantageously has shallow channel depths. In a structure having an excessive number of grain boundaries, such as the structure of columnar polysilicon layer 132, dopants diffuse rapidly down the grain boundaries so that the junction depths of regions such as a channel region or source/drain region are consistently deeper than occurs for a single-crystalline structure.

Although the described embodiment includes two diverse polysilicon layers, the columnar polysilicon layer 132 and the amorphous polysilicon layer 134, other embodiments may include additional polysilicon layers having different crystalline characteristics. For example, one embodiment includes two layers of low-quality columnar polysilicon layered above and below to surround a high-quality amorphous layer. In one such embodiment, a first layer of low-quality columnar polysilicon is deposited, a trench is etched into the columnar polysilicon, a high-quality amorphous polysilicon layer is formed and etched to fill the trench, and a second layer of low-quality columnar polysilicon is deposited over the first layer of low-quality columnar polysilicon and the filled trench. A buried layer of high-quality amorphous polysilicon is useful for improving leakage properties of substrate in a deeply buried portion of a doped region in a transistor. In some embodiments, a buried transistor may be formed with source, drain and channel regions positioned in the region of a buried amorphous trench so that multiple transistors may be compactly arranged in a three-dimensional space of a wafer. Accordingly, unique and advantageous transistor arrangements and configurations are attainable using buried transistors in the vicinity of buried amorphous layers.

In other embodiments, a plurality of amorphous layers are formed in buried regions distributed throughout a polysilicon material in a semiconductor wafer along with an amorphous polysilicon layer formed on the surface of the wafer.

Figure 2H:
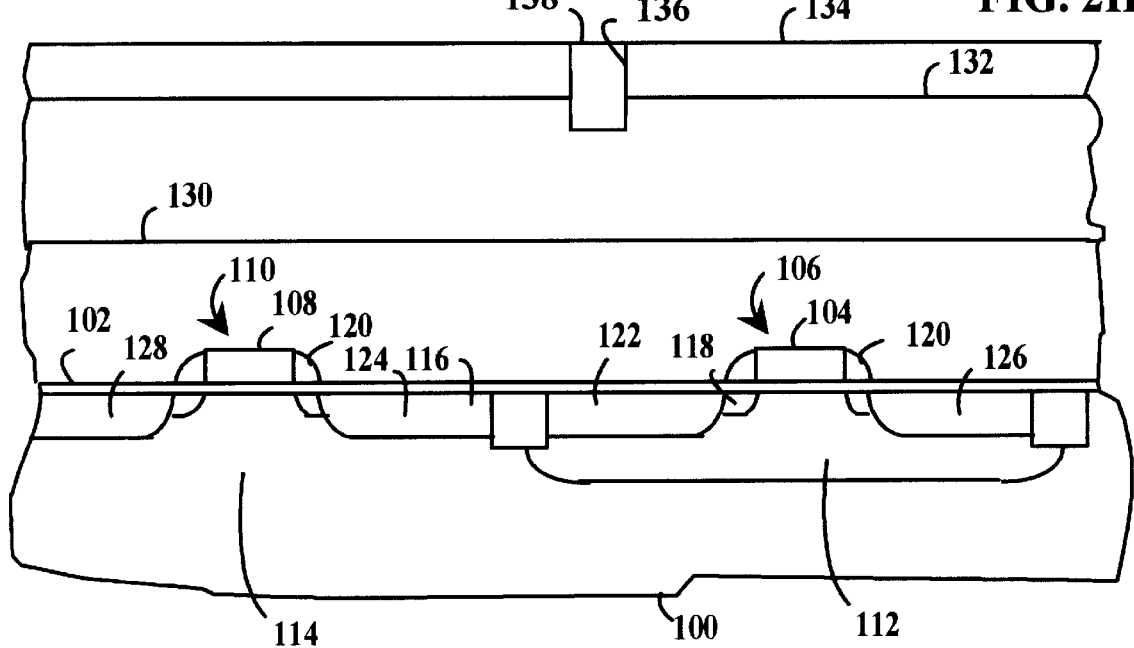

Referring to FIG. 2H, an isolation trench 136 is etched into a selected region of the amorphous polysilicon layer 134 and the columnar polysilicon layer 132 so supply isolation between devices that are not yet formed on the surface of the amorphous polysilicon layer 134. The trench 136 is formed into the amorphous polysilicon layer 134 and columnar polysilicon layer 132 to a selected depth, typically in a range from 0.025 µm to 0.25 µm. Although the trench 136 is illustratively formed preceding formation of devices on the surface of the amorphous polysilicon layer 134, in other embodiments, the source/drain implants of devices may be performed after the trench 136 is etched. The trench 136 is formed using any suitable etch technique including anisotropic and isotropic etch procedures, and wet and dry etch techniques. Generally substantially vertical walls of the trench 136 are desired so that anisotropic etching is highly suitable in comparison to isotropic etching. Furthermore, dry etch techniques are highly suitable in comparison to wet etch techniques to achieve a uniform and controlled trench depth.

In the illustrative embodiment, the trench 136 is formed using an anisotropic dry etch that is suitable for etching silicon. Suitable etch techniques include plasma etch processes, reactive ion etching (RIF) processes, and the like. The trench 136 is formed by patterning a photoresist mask (not shown) over the surface of the amorphous polysilicon layer 134 and is shown in a rectangular shape. In other embodiments, the trench 136 may have a shape other than rectangular. The photoresist mask protects surface regions of the amorphous polysilicon layer 134 surrounding the trench 136 but leaves a region of the trench 136 exposed. The etch procedure forms substantially vertical sidewalls and a substantially planar floor of the trench 136.

The isolation trench 136 is filled with a suitable dielectric material such as silicon dioxide ($SiO_2$) 138 which is formed over the amorphous polysilicon layer 134 typically by chemical vapor deposition (CVD) at a temperature in the range of 300° C. to 400° C. to a level that at least fills the isolation trench 136. The layer of silicon dioxide 138 is planarized, for example by chemical-mechanical polishing or by reflow. The silicon dioxide 138 in the isolation trench 136 mutually isolates devices formed on the surface of the amorphous polysilicon layer 134.

In other embodiments, isolation is supplied by LOCOS isolation methods rather than trench isolation.

Figure 2I:
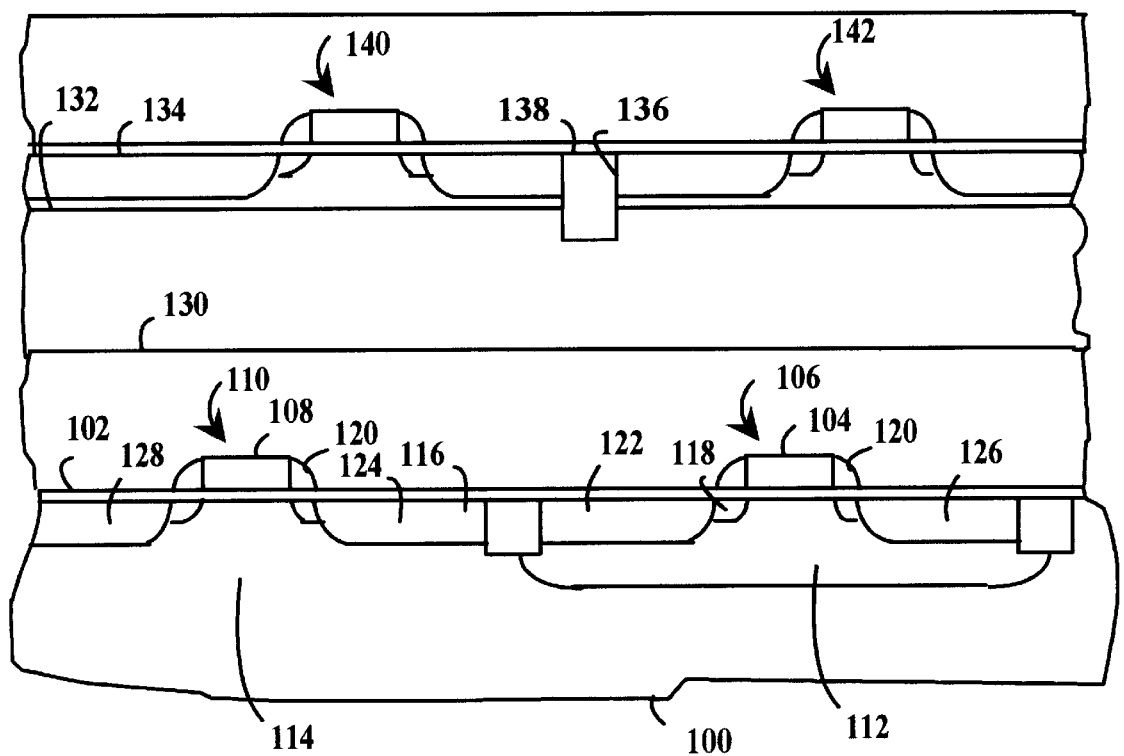

Referring to FIG. 2I, transistors 140 and 142 are formed using fabrication techniques generally similar to the processes discussed previously with reference to FIGS. 2A through 2D.

Referring to FIG. 3, a computer system 300 includes an integrated circuit 302, a central processing unit 304, a memory 306, and an interface 308, connected to a modem 310. The computer system 300 also includes a keyboard 312 and a display 314 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention Variations and modifications of the embodiments disclosed herein may be made based on the description set forth herein, without departing from the scope and spirit of the invention as set forth in the following claims.

What is claimed is:

1. A method of fabricating an integrated circuit comprising:

forming a transistor on a substrate;

forming an intralayer dielectric (ILD) layer overlying the substrate and the transistor;

depositing a layer of columnar polysilicon overlying the ILD layer using chemical vapor deposition (CVD);

depositing a layer of amorphous polysilicon overlying the columnar polysilicon using CVD; and forming a transistor on the layer of amorphous polysilicon.

2. A method according to claim 1, further comprising:

planarizing the ILD layer prior to depositing the layer of columnar polysilicon.

3. A method according to claim 1, wherein forming a transistor on the substrate further comprises:

depositing a gate oxide layer on the substrate;

forming a gate on the substrate overlying the gate oxide layer; and implanting source and drain regions into the substrate self-aligned with respect to the gate.

4. A method according to claim 1, wherein depositing a layer of columnar polysilicon overlying the ILD layer further comprises:

depositing polysilicon using chemical vapor deposition of silane at a temperature higher than 580° C.

5. A method according to claim 1, wherein depositing a layer of columnar polysilicon overlying the ILD layer further comprises:

depositing polysilicon using chemical vapor deposition of silane at a temperature approximately 620° C.

6. A method according to claim 1, wherein depositing a layer of columnar polysilicon overlying the ILD layer further comprises:

depositing polysilicon using chemical vapor deposition to a thickness of less than 1000 Å.

7. A method according to claim 1, wherein depositing a layer of amorphous polysilicon overlying the ILD layer further comprises:

depositing polysilicon using chemical vapor deposition of silane at a temperature lower than 580° C.

8. A method according to claim 1, wherein depositing a layer of amorphous polysilicon overlying the ILD layer further comprises:

depositing polysilicon using chemical vapor deposition of silane at a temperature lower than 600° C.

9. A method according to claim 1, wherein depositing a layer of columnar polysilicon overlying the ILD layer further comprises:

depositing polysilicon using chemical vapor deposition to a thickness in a range from 500 Å to 5000 Å.

10. A method according to claim 1, wherein depositing a layer of columnar polysilicon and depositing the layer of amorphous polysilicon further comprise:

depositing polysilicon using chemical vapor deposition using a silicon deposition gas selected from among the gases of silane ($SiH_4$), silicon tetrachloride ($SiCl_4$), dichlorosilane ($SiH_2Cl_2$), or trichlorosilane ($SiHCl_3$).

* * * * *

UNITED STATES PATENT AND TRADEMARK OFFICE
CERTIFICATE OF CORRECTION

PATENT NO.    : 5,888,853
ISSUE DATE    : March 30, 1999
INVENTOR(S)   : Gardner, Mark I.; Kadosh, Daniel; Duane, Michael It is certified that error appears in the above-identified patent and that said Letters Patent is hereby corrected as shown below:

Column 3, line 55; please delete "transisters" and insert --transistors--, *and*
Column 5, line 41; please delete "transisters" and insert --transistors--.

Signed and Sealed this

Twenty-seventh Day of July, 1999

Attest:

Q. TODD DICKINSON

*Attesting Officer*    *Acting Commissioner of Patents and Trademarks*